United States Patent
Yoon

(10) Patent No.: US 8,416,601 B2
(45) Date of Patent: Apr. 9, 2013

(54) PHASE CHANGE RANDOM ACCESS MEMORY APPARATUS FOR CONTROLLING DATA TRANSMISSION

(75) Inventor: Tae Hun Yoon, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 515 days.

(21) Appl. No.: 12/641,200

(22) Filed: Dec. 17, 2009

(65) Prior Publication Data

US 2010/0302840 A1 Dec. 2, 2010

(30) Foreign Application Priority Data

May 29, 2009 (KR) .................. 10-2009-0047397

(51) Int. Cl.
*G11C 11/00* (2006.01)
(52) U.S. Cl. ...................... 365/148; 365/154
(58) Field of Classification Search .................. 365/148, 365/154

See application file for complete search history.

(56) References Cited

U.S. PATENT DOCUMENTS

| 7,535,747 | B2 | 5/2009 | Lee et al. | |
| 7,573,758 | B2 | 8/2009 | Park et al. | |
| 2008/0055963 | A1 | 3/2008 | Lee et al. | |
| 2008/0068903 | A1 | 3/2008 | Park et al. | |
| 2008/0151656 | A1* | 6/2008 | Nakai | 365/189.16 |
| 2008/0285334 | A1* | 11/2008 | Chow et al. | 365/163 |

FOREIGN PATENT DOCUMENTS

KR 10-2005-0030294 A 3/2005

* cited by examiner

*Primary Examiner* — Anthan Tran
(74) *Attorney, Agent, or Firm* — William Park & Associates Ltd.

(57) ABSTRACT

A phase change memory apparatus includes: a plurality of sub blocks; a latch block connected in common with the sub blocks through a read bus and configured to latch data from one of the sub blocks; and a comparator connected in common with the sub blocks to receive data from a write bus, and configured to compare data of the latch block with the data of the write bus to generate a comparison signal, which is effective in improving areal efficiency by sharing the latch block among the sub blocks in the unit mat.

16 Claims, 4 Drawing Sheets

106

PHASE CHANGE RANDOM ACCESS MEMORY APPARATUS FOR CONTROLLING DATA TRANSMISSION

CROSS-REFERENCES TO RELATED APPLICATIONS

The present application claims priority under 35 U.S.C. 119(a) to Korean Application No. 10-2009-0047397 filed on May 29, 2009, which is incorporated herein by reference in its entirety as set forth in full.

BACKGROUND

1. Technical Field

The embodiments described herein generally relate to phase change random access memory apparatuses, and more particularly, to a phase change random access memory apparatus for controlling data transmission.

2. Related Art

A phase change random access memory (hereinafter, referred to as 'PRAM') apparatus contains unit cells each of which includes a switching device (e.g., diode) coupled to a word line, and a single element variable resistor (GST; $Ge_x$-$Sb_yTe_z$) coupled to a bit line. Such a PRAM is capable of storing data in the unit cells by reversibly controlling the physical phase of the GST in response to electrical pulses.

Usually, a PRAM apparatus has a hierarchical structure together with other phase change memory apparatuses. For instance, a PRAM apparatus includes a plurality of banks each having a plurality of mats. Each individual mat includes sub blocks arranged as cell array units. With this structure, data can be read out from a selected cell array, or written into a selected cell array from an outside system.

In order to maintain the functional stability of reading or programming operations, it is necessary to preserve read data for a predetermined reading time for a read operation, or to preserve write data for a predetermined programming time for a write operation. Therefore, each sub block including the cell array is required to have latch circuits for temporarily holding data therein. In order to fulfill this requirement, a PRAM apparatus must be enlarged and its integration density increased.

SUMMARY OF THE INVENTION

Embodiments of the present invention provide a PRAM apparatus which accomplishes improved areal efficiency.

In an embodiment, a phase change memory apparatus includes: a plurality of sub blocks; a latch block connected in common with the sub blocks through a read bus, and configured to latch data from one of the sub blocks; and a comparator connected in common with the sub blocks to receive data from a write bus, and configured to compare data of the latch block with the data of the write bus to generate a comparison signal.

In another embodiment, a phase change memory apparatus includes: a mat including a plurality of sub blocks; and a latch block disposed in the mat and connected in common with the sub blocks through a read bus, configured to latch data of one of the sub blocks that is selected by a sub-block selection signal.

In another embodiment, a phase change memory apparatus includes: a plurality of sub blocks; a latch block connected in common with the sub blocks through a read bus and configured to latch data from one of the sub blocks; and a comparator connected in common with the sub blocks to receive data from a write bus, and configured to compare data of the latch block with data of the write bus, wherein, when one of the sub blocks is selected in response to a write command, data that is read out from the selected sub block is compared to the data from the write bus.

In another embodiment, a phase change memory apparatus includes: a plurality of sub blocks; a latch block connected in common with at least two sub blocks through a read bus, and configured to latch data from one of the at least two sub blocks; and a comparator connected in common with the at least two sub blocks to receive data from a write bus, and configured to compare data in the latch block with the data of from write bus to generate a comparison signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Figure 1:
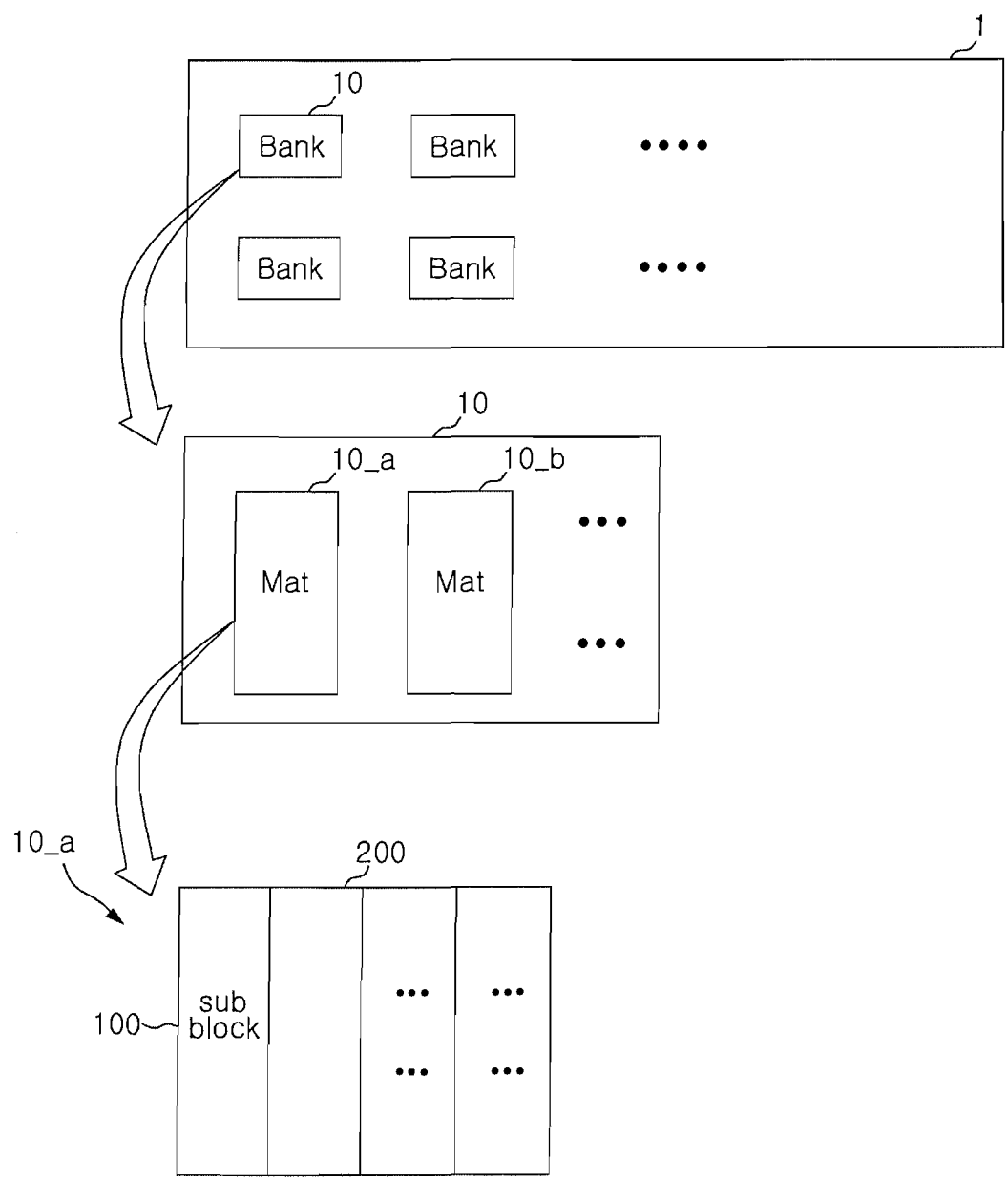
FIG. 1 is a block diagram illustrating a hierarchical structure of a PRAM apparatus according to an embodiment of the present invention.

Various exemplary embodiments will now be described more fully with reference to the accompanying drawings in which some exemplary embodiments are shown. However, specific structural and functional details disclosed herein are merely representative for purposes of describing exemplary embodiments. The invention, however, may be embodied in many alternate forms and should not be construed as limited to only exemplary embodiments set forth herein.

Accordingly, while exemplary embodiments are capable of various modifications and alternative forms, embodiments thereof are shown by way of example in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the invention. Like numbers refer to like elements throughout the description of the drawings.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be also understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting to exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe exemplary embodiments, various aspects will be described in detail with reference to the attached drawings.

FIG. 1 is a block diagram illustrating a hierarchical structure of a PRAM apparatus 1 according to an embodiment of the present invention in block level.

Referring to FIG. 1, the PRAM apparatus 1 includes a plurality of banks 10. The bank 10 includes a cell array which comprises a plurality of memory cells (or unit cells). The bank 10 may be formed in a hierarchical structure. In particular, each bank includes predetermined units of memory blocks, i.e., a plurality of mats 10_a, 10_b, etc., and each mat includes a plurality of sub blocks 100, 200, etc.

In the embodiment of the present invention, each of the sub blocks 100, 200 is considered to include a unit cell array and peripheral circuits (e.g., sense amplifiers and write drivers) for controlling the unit cell array.

As stated above, typically each of the sub blocks is equipped with latches for temporarily holding data.

According to the embodiment of the present invention, the plurality of sub blocks, 100, 200, etc, are arranged to share a single data latch circuit. That is, each mat is equipped with a single data latch circuit to enhance areal efficiency.

Hereinafter, a proposed configuration relevant to the data latch circuit for areal efficiency will be explained in more detail.

Figure 2:
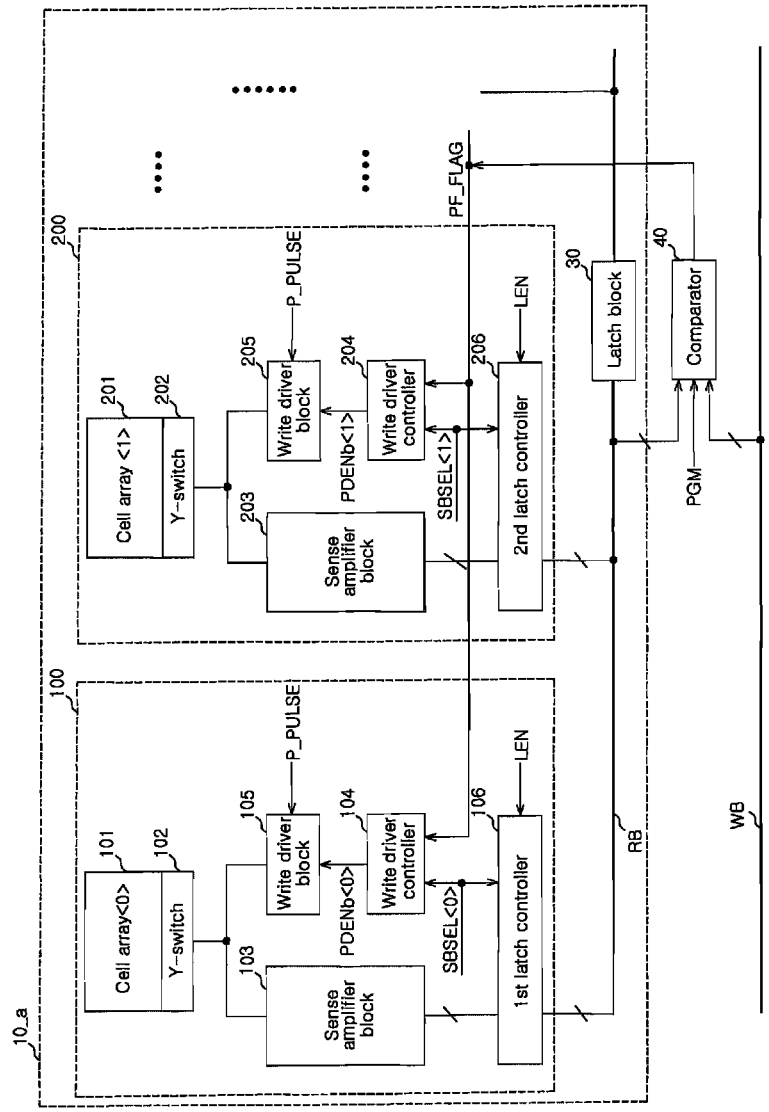
FIG. 2 is a block diagram illustrating a relationship between a comparator and a single mat shown in FIG. 1.

FIG. 2 is a block diagram illustrating a relationship between a comparator and a single mat shown in FIG. 1. Referring to FIG. 2, the unit mat (e.g., 10_a) includes a plurality of sub blocks, i.e., a first sub block 100 and a second sub block 200 and so on, together with a latch block 30.

For the sake of explanation, it is assumed that the PRAM apparatus 1 includes eight mats per bank and is operable in 2-bit MLC ('multi-level cell') mode. That is, each mat can be assigned with two DQ pins to input/output 2-bit data to and from the mat. With this structure, reading 16-bit data from one bank is accomplished by reading 2-bit data from each mat in the selected bank.

As illustrated in FIG. 2, the first sub block 100 includes a cell array<0> 101, a column selector (Y-switch) 102, a sense amplifier block 103, a write driver block 105, a write driver controller 104, and a first latch controller 106.

The second sub block 200 includes a cell array<1> 201, a column selector (Y-switch) 202, a sense amplifier block 203, a write driver block 205, a write driver controller 204, and a second latch controller 206.

Although not shown in FIG. 2, other sub blocks have a similar structure as the first and second sub blocks 100 and 200.

These sub blocks, 100, 200, etc., are arranged to share the single latch block 30 disposed in a unit mat. That is, data sensed from the sub blocks, 100, 200, etc., are held in the shared latch block 30, rather than maintained in the respective sub blocks. According to the embodiment of the present invention, a control signal is provided for selecting one of the sub blocks so that only data from the selected sub block is maintained in the latch block 30. This control scheme is possible for PRAMs because, unlike flash memories, PRAMs are designed to select and program a single cell in each mat at a time, which prevents the programming current from being concentrated in a single mat. Since only a single sub block is activated in the corresponding mat in response to a read command, data from only the activated sub block has to be held in the latch block 30 for a predetermined time. Hence, it is not necessary to prepare a latch circuit for each and every sub block. Furthermore, the single latch block 20 is disposed in a marginal region of each of the mats sharing the same word line. Moreover, the signals manifesting information on which sub block is the corresponding one is used as control signals to transfer data to the latch block 30 from the corresponding sub block. Therefore, according to the embodiment, not every sub block needs to be equipped with a latch circuit, which improves areal efficiency of the PRAM apparatus.

Hereinafter, in order to obviate descriptive duplications, structural and operational characteristics of the first sub block 100 will be described as a representative example of sub blocks.

The cell array<0> 101 includes a plurality of PRAM cells. Each PRAM cell is composed of a switching device (e.g., diode) electrically coupled to a word line (not shown), and a variable resistor (GST) electrically coupled to a bit line (not shown).

The column selector 102 controls bit lines to be selected by column addresses.

The sense amplifier block 103 includes sense amplifiers, and operates to detect data from the PRAM cells through bit lines designated by the column selector 102.

Sensed data is held in the latch block 30 for a predetermined time through the first latch controller 106. Here, the predetermined time may be the period of time for detecting a voltage level of data sensed from the selected PRAM cell for a read operation, or the period of time necessary for the data to be fully written into the selected PRAM cell for a write operation.

In particular, the first latch controller 106 is disposed in the first sub block 100. The first latch controller 106 is controlled by a first sub-block selection signal SBSEL<0> and a latch enable signal LEN to permit data to be transferred into the latch block 30 which is disposed outside the first sub block 100 only when the corresponding cell array thereto is selected. According to the embodiment of the present invention, the first sub-block selection signal SBSEL<0> may be activated according to a column address provided in response to a read or write command, and the first latch controller 106 can be controlled such that only data from the first sub block 100 is stored at the latch block 30 in response to the first sub-block selection signal SBSEL<0>. That is, the first latch controller 106 can control data transmission such that only data of the first sub block 100 is stored at the latch block 30 in response to the first sub-block selection signal SBSEL<0> during a read or write operation. The latch enable signal LEN is a signal that is activated when data latch is necessary, i.e., a signal operative in response to a read or write command.

The latch block 30 is disposed in the mat (e.g., 10_a) and connected in common with the plurality of sub blocks 100, 200, etc. For example, data transferred from the first latch controller 106 in the first sub block 100 may be stored in the latch block 30 through a read bus RB. Also, data transferred from the second latch controller 206 in the second sub block 200 may be stored in the latch block 30 through the read bus RB. For the purpose of enhancing areal efficiency, the latch block 30 may be disposed in a marginal region in the first mat 10_a, although the embodiments of the invention will not be limited thereto. It is also possible to dispose the latch block 30 around the center of the sub blocks, not in a region that offers a wide margin so as to improve the signal distortion and transmission characteristics.

On the other hand, a write operation that changes state of the PRAM cell between the reset and set states needs the application of a large amount of writing current for a considerably long time (e.g., 100 ns). Accordingly, new write operation mechanisms have been proposed these days to reduce the current consumption. For instance, one of the proposed write operation mechanisms provides that a predetermined amount of write current (based on a write voltage pulse) is applied to a selected memory cell, and the actual amount of write current is controlled to be smaller or larger depending on the verification result on whether data has been successfully written into the selected memory cell. That is, a write current is repeatedly applied to a selected memory cell after reading the selected memory cell and verifying whether data of the selected memory cell is substantially identical to the data to be written. This process for the write operation is referred to as 'verify-reading'. In the embodiments of the present invention, there is a provided a nonvolatile semiconductor memory circuit conducting verify-read operations in write operation mode.

The write driver controller 104 is capable of driving the write driver block 105 in response to the first sub-block selection signal SBSEL<0> and a comparison signal PF_FLAG. That is, the write driver controller 104 provides a first write-driver enable signal PDENb<0> in response to the first sub-block selection signal SBSEL<0> and the comparison signal PF_FLAG. Here, the comparison signal PF_FLAG is generated from a comparator 40 which will be described later. The comparison signal PF_FLAG is exemplified as a global signal to be provided into the sub blocks 100, 200, etc.

In response to the first write-driver enable signal PDENb<0>, the write driver block 105 is controlled to write the input data into the cell array<0> 101 by applying a write current to the designated memory cell for the duration of a write pulse P_PULSE.

The comparator 40 disposed outside the mat 10_a compares an output signal of the latch block 30 with the input data transferred through a write bus WB, in response to a write command PGM, and generates the comparison signal PF_FLAG.

In particular, the comparator 40 determines whether to drive the write driver controller 104 based on the comparison result of input data to be written into the cell array<0> 101 with data of the cell array<0> 101 provided from the latch block 104. If the level of the input data is equal to the level of data in the latch block 30, thus eliminating the need of continuing the write operation, the comparator 40 inactivates the comparison signal PF_FLAG. If, however, the level of input data is not equal to the level of data in the latch block 30, the comparator 40 activates the comparison signal PF_FLAG since the write operation should be continued until the data of the latch block 30 reaches a target level.

In this particular embodiment, the latch block 30 is illustrated to be shared by all the sub blocks 100, 200, etc. in the unit mat 10_a in FIG. 2. That is, the single latch block 30 is coupled to all the sub blocks 100, 200, etc. in the unit mat 10_a through the common read bus RB. The skilled in the art, however, will understand that only part of the sub blocks 100, 200, etc. may share the latch block 30, and other sub blocks 100, 200, etc. may have their own latch blocks (not shown) which are distinct from the latch block 30.

Figure 3:
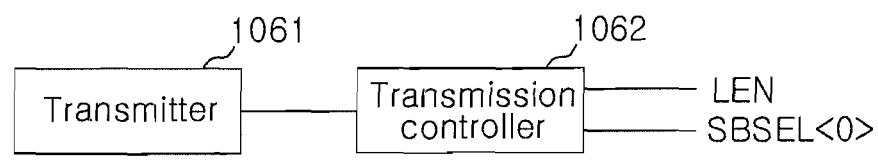
FIG. 3 is a block diagram schematically illustrating a first latch controller shown in FIG. 2.

FIG. 3 schematically illustrates the first latch controller 106 shown in FIG. 2.

Referring to FIG. 3, the first latch controller 106 includes a transmitter 1061 and a transmission controller 1062.

The transmission controller 1062 is capable of controlling the transmitter 1061 in response to the latch enable signal LEN and the first sub-block selection signal SBSEL<0>. In particular, the transmission controller 1062 permits data of the first sub block 100 to be transferred to the read bus RB only when the latch enable signal LEN and the first sub-block selection signal SBSEL<0> are all activated.

Figure 4:
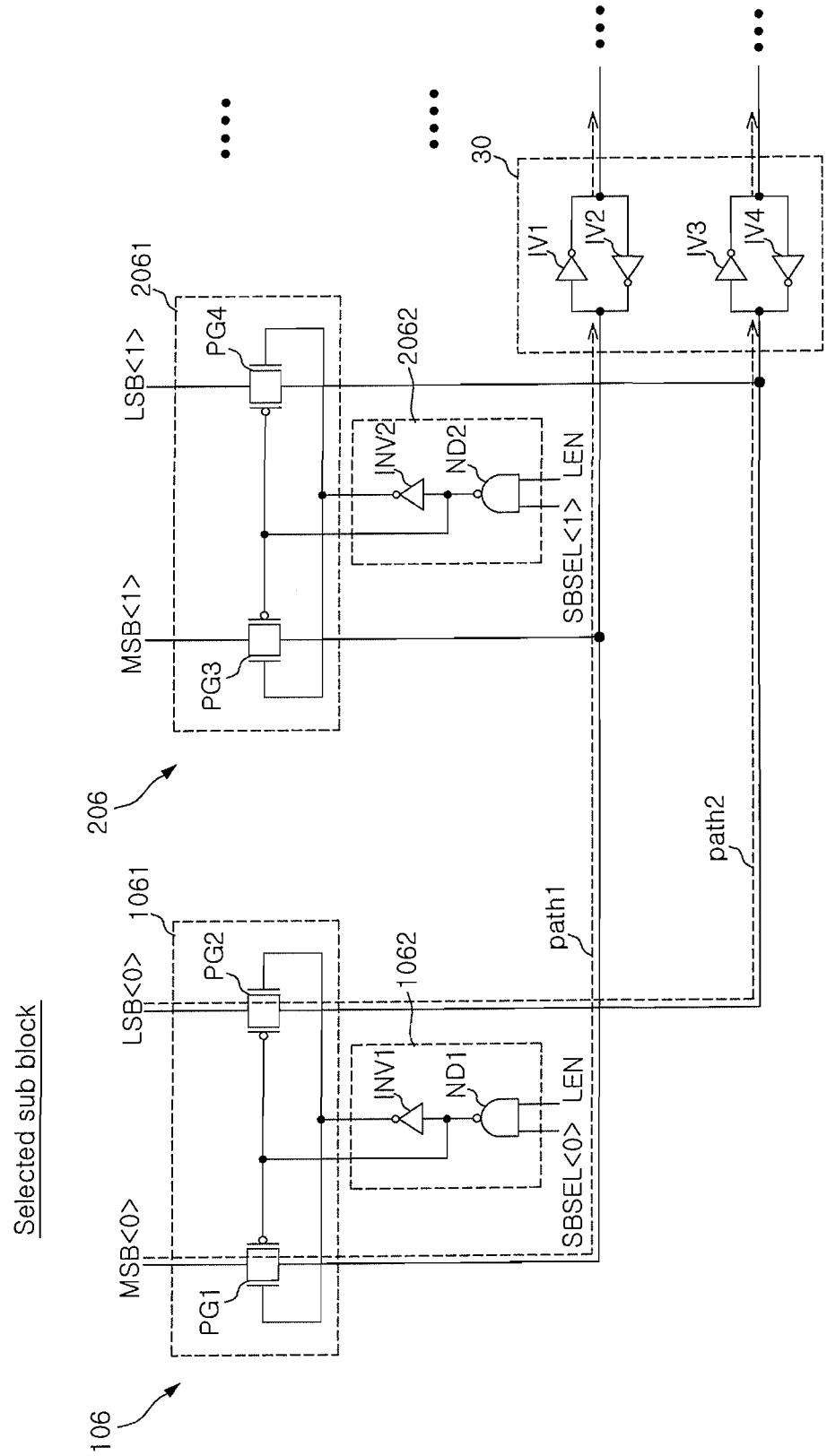
FIG. 4 is a circuit diagram schematically illustrating a data flow in selected and unselected sub blocks, according to FIGS. 2 and 3.

FIG. 4 schematically illustrates a data flow in selected and unselected sub blocks, corresponding to the configuration of FIGS. 2 and 3.

Referring to FIG. 4, the transmitter 1061 of the first latch controller 106 includes first and second transmission gates PG1 and PG2 which transfer 2-bit data, i.e., the most and least significant bits MSB and LSB, from the cell array<0> 101 of the first sub block 100.

The transmission controller 1062 of the first latch controller 106 includes a first NAND gate ND1 and a first inverter INV1.

The first NAND gate ND1 receives the latch enable signal LEN and the first sub-block selection signal SBSEL<0>, and executes a NAND operation on them.

The first inverter INV1 receives and inverts the output signal of the first NAND gate ND1.

Similarly, a transmitter 2061 of the second latch controller 206 includes third and fourth transmission gates PG3 and PG4 which transfer 2-bit data, i.e., the most and least significant bits MSB and LSB, from the cell array<1> 201 of the second sub block 200.

A transmission controller 2062 of the second latch controller 206 includes a second NAND gate ND2 and a second inverter INV2.

The second NAND gate ND2 receives the latch enable signal LEN and the second sub-block selection signal SBSEL<1>, and executes a NAND operation on them.

The second inverter INV2 receives and inverts the output signal of the second NAND gate ND2.

The latch block 30 includes a first pair of first and second inverters IV1 and IV2, and a second pair of third and fourth inverters IV3 and IV4, the pairs of which are each coupled in a latch circuit form. In the latch block 30, the first pair of the inverters IV1 and IV2, as a single latch unit, stores the MSB of the corresponding sub block and the second pair of the inverters IV3 and IV4, as the other single latch unit, stores the LSB of the corresponding sub block.

Now, the operation of the memory apparatus in accordance with an embodiment will be described with reference to FIGS. 2 through 4.

If the first sub block 100 is selected in response to a read command, the first sub-block selection signal SBSEL<0> is activated. Thereafter, the first NAND gate ND1 which receives the latch enable signal LEN and the first sub-block selection signal SBSEL<0>, both of which are high level, outputs a low level signal to turn the first and second transmission gates PG1 and PG2 on. Thus, the MSB and the LSB are stored in the latch block 30 through the read bus RB from the cell array<0> 101 of the first sub block 100 (refer to path1 and path2 in FIG. 4).

Next, in writing mode, if the second sub block 200 is selected in response to a write command PGM, the second NAND gate ND2 outputs a low level signal in response to the second sub-block selection signal SBSEL<1> that is activated. Thereafter, the third and fourth transmission gates PG3 and PG4 are turned on to transfer the MSB and LSB to the latch block 30 from the cell array<1> 201 of the second sub block 200 through the read bus RB.

Meanwhile, responding to the write command PGM, the comparator 40 can compare the MSB and LSB data of the latch block 30 with input data that is received through the write bus WB. From the comparison, if the data of the latch block 30 is not the target level to be written, the comparator 40 provides the comparison signal PF_FLAG to the write-driver controllers 104, 204, etc. in all of the sub blocks 100, 200, etc. Not all of the write-driver controllers 104, 204, etc. are enabled to operate even if they receive the activated comparison signal PF_FLAG. Instead, only the second write-driver controller 204 that received the second sub-block selection signal SBSEL<1> is enabled to operate. That is, in response to the activated comparison signal PF_FLAG and the second sub-block selection signal SBSEL<1>, the second write driver controller 204 enables the write driver block 205 to apply a larger amount of write current to the cell array<1> of the second sub block 200 for data writing.

As described above, the PRAM apparatus according to the exemplary embodiments of the present invention is effective in improving areal efficiency by sharing the latch block with the sub blocks in the unit mat.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A phase change memory apparatus, comprising:
a plurality of sub blocks;
a plurality of latch controllers, wherein each of the plurality latch controllers is coupled to the plurality of sub blocks and transmits data outputted from the coupled sub blocks in response to a latch enable signal and a sub-block selection signal which is generated based on an address of the at least one of the sub blocks provided in response to a read or a write commands, wherein the plurality of the latch controllers is connected to the latch enable signal and sub-block selection signal;
a latch block coupled in common with the plurality of latch controllers, and configured to latch data outputted from one of the latch controllers; and
a comparator connected in common with the sub blocks to receive data from a write bus, and configured to compare data of the latch block with the data of the write bus to generate a comparison signal, wherein the comparison signal controls a write driver controller.

2. The phase change memory apparatus according to claim 1, wherein the latch controller transfers the data from the at least one of the sub blocks when the sub-block selection signal and the latch enable signal are activated.

3. The phase change memory apparatus according to claim 1, wherein the latch block comprises a predetermined number of latch units, and the predetermined number corresponds to a number of bits of the data provided from at least one of the sub blocks.

4. The phase change memory apparatus according to claim 1, wherein the comparator inactivates the comparison signal when the data of the write bus is substantially identical to the data of the latch block, and
wherein the comparator activates the comparison signal if the data of the write bus is not substantially identical to the data of the latch block.

5. The phase change memory apparatus according to claim 1, wherein the latch controller receives a latch enable signal and a sub-block selection signal based on an address of the one of the at least two sub blocks in response to a read or write command, and transfers the data from the one of the at least two sub blocks when the sub-block selection signal and the latch enable signal are activated.

6. A phase change memory apparatus, comprising:
a mat including a plurality of sub blocks;
a latch block disposed in the mat and connected in common with the sub blocks through a read bus, configured to latch data of one of the sub blocks that is selected by a sub-block selection signal which is generated based on an address signal of the at least one of the sub blocks provided in response to a read or a write commands;
a plurality of latch controllers, wherein each of the plurality of latch controllers is coupled between the plurality of the sub blocks and the latch block, and is configured to transmit data from one of the sub blocks to latch block in response to a latch enable signal wherein the plurality of the latch controllers is connected to the latch enable signal and sub-block selection signal; and
a comparator connected in common with the sub blocks to receive data from a write bus, and configure to compare data of the latch block with data of the write bus
wherein, when one of the sub block is selected in response to the write command, data that is read out from the selected sub block is compared to the data from the write bus.

7. The phase change memory apparatus according to claim 6, wherein, when one of the sub blocks is selected in response to the read or write command, the latch block reads data from the selected sub block and latches the read data through the read bus.

8. The phase change memory apparatus according to claim 6, wherein the latch controller operates based on the latch enable signal and the sub-block selection signal activated in response to a read or write command, and transfers data from the at least one of the sub blocks when the sub-block selection signal and the latch enable signal are all activated.

9. The phase change memory apparatus according to claim 7, wherein the latch block comprises a predetermined number of latch units, and the predetermined number corresponds to a number of bits of the data provided from at least one of the sub blocks.

10. A phase change memory apparatus, comprising:
a plurality of sub blocks;
a latch block connected in common with the sub blocks through a read bus and configured to latch data from one of the sub blocks;

a latch controller configured to transfer the data from one of the sub blocks to the latch block in response to a latch enable signal and a block selection signal which is generated based on an address signal of the at least one of the sub blocks provided in response to a read or a write commands wherein the latch controller is connected to the latch enable signal and a sub-block selection signal; and a comparator connected in common with the sub blocks to receive data from a write bus, and configured to compare data of the latch block with data of the write bus, wherein, when one of the sub blocks is selected in response to the write command, data that is read out from the selected sub block is compared to the data from the write bus.

11. The phase change memory apparatus according to claim 10, wherein the latch controller transfers the data from the selected sub block when the sub-block selection signal and the latch enable signal are activated.

12. The phase change memory apparatus according to claim 10, wherein the latch block comprises a predetermined number of latch units, and the predetermined number corresponds to a number of bits of the data provided from at least one of the sub blocks.

13. The phase change memory apparatus according to claim 10, wherein the comparator inactivates a comparison signal when the data from the write bus is substantially identical to the data of the latch block, and
wherein the comparator activates the comparison signal if the data of the write bus is not substantially identical to the data of the latch block.

14. The phase change memory apparatus according to claim 11, wherein at least one of the sub blocks comprises:
a write-driver controller configured to operate based on the comparison signal and the sub-block selection signal activated in response to the write command; and
a write driver block controlled by the write-driver controller and applying a write current in response to the data from the write bus.

15. The phase change memory apparatus according to claim 14, wherein the write-driver controller provides a write-driver control signal in response to the sub-block selection signal and the comparison signal.

16. The phase change memory apparatus according to claim 15, wherein the write driver block writes the data in response to the write-driver control signal.

* * * * *